United States Patent [19]

Schäfer

[11] Patent Number: 5,843,621

[45] Date of Patent: *Dec. 1, 1998

[54] PROCESS AND APPARATUS FOR COATING PRINTED CIRCUIT BOARDS

[75] Inventor: Hans-Jürgen Schäfer, Viersen, Germany

[73] Assignee: Ciba-Geigy AG, Basle, Switzerland

[ * ] Notice: This patent issued on a continued prosecution application filed under 37 CFR 1.53(d), and is subject to the twenty year patent term provisions of 35 U.S.C. 154(a)(2).

[21] Appl. No.: 549,684

[22] PCT Filed: May 10, 1994

[86] PCT No.: PCT/IB94/00101

§ 371 Date: Feb. 27, 1996

§ 102(e) Date: Feb. 27, 1996

[87] PCT Pub. No.: WO94/27189

PCT Pub. Date: Nov. 24, 1994

[30] Foreign Application Priority Data

| May 12, 1993 | [DE] | Germany | 43 15 774.2 |
| Jul. 22, 1993 | [DE] | Germany | 43 24 585.4 |
| Sep. 3, 1993 | [DE] | Germany | 43 29 730.7 |
| Sep. 3, 1993 | [DE] | Germany | 43 29 731.5 |
| Nov. 8, 1993 | [DE] | Germany | 43 37 907.9 |

[51] Int. Cl.$^6$ ............... G03F 7/38; B05B 5/00; B05C 1/00; B05C 11/00
[52] U.S. Cl. ............... 430/273.1; 430/296; 430/312; 430/313; 430/315; 430/319; 430/330; 118/72; 118/239; 118/641
[58] Field of Search ............... 430/312, 313, 430/315, 330, 296, 273.1, 319; 118/72, 239, 641

[56] References Cited

U.S. PATENT DOCUMENTS 5,049,478  9/1991  Koch et al. ............... 430/270

FOREIGN PATENT DOCUMENTS

| 0 362 641A2 | 4/1990 | European Pat. Off. . |
| 0 442 196A2 | 8/1991 | European Pat. Off. . |
| 92 01 546.8 | 7/1992 | Germany . |
| 93/14444 | 7/1993 | WIPO . |

OTHER PUBLICATIONS

"Advances in Liquid Photoimageable Solder Mask Technology", Susan Crum, Electronic Packaging & Production, vol. 33, No. 9, Sep. 1993, pp. 78–81.

*Primary Examiner*—Christopher G. Young
*Attorney, Agent, or Firm*—Burns, Doane, Swecker & Mathis, LLP

[57] ABSTRACT

A process for coating printed circuit boards is described, comprising the following process steps:

the printed circuit boards on the coating side are kept at room temperature and, as appropriate, are heated to approximately 120° C.; then in a first step, a preferably photopolymerisable, meltable, low-molecular-weight coating composition that preferably has an average molecular weight of from 500 to 1500 and that is highly viscous to solid at room temperature is coated in a thickness of approximately from 10 μm to 200 μm on to the surface(s) of the printed circuit board to be coated;

in a second step, a second, high-molecular-weight, photopolymerisable coating composition preferably having an average molecular weight of from 2000 to 10000 is applied in a thickness of from 2 μm to 20 μm over the first layer; and the printed circuit boards so coated are cooled to room temperature and the two-layer photopolymerisable coating is exposed, preferably in contact with a mask, is developed and is cured fully.

An apparatus for carrying out the process outlined above is also described.

28 Claims, 4 Drawing Sheets

PROCESS AND APPARATUS FOR COATING PRINTED CIRCUIT BOARDS

BACKGROUND OF THE INVENTION

The invention relates to a process for coating printed circuit boards with a coating that is crosslinkable by electromagnetic radiation, especially UV radiation,. The invention relates also to an apparatus suitable for that purpose and to the use of the process for various purposes.

The function of the printed circuit board is to provide the conductive connection to the components. As miniaturisation progresses, the number of connections is becoming ever greater, with the result not only that printed circuit board technology has produced multilevel circuitry, but also that conductive tracks are becoming ever narrower, drill hole diameters are becoming ever smaller and the number of conductive tracks between two holes is becoming ever greater.

With the development of surface-mounted devices it has been possible to achieve a further reduction in the surface area required. This has led to conductor widths of less than 100 μm, to drill hole diameters of from 0.3 to 0.2 mm and to solder point diameters of only up to 0.4 mm with up to seven conductive tracks between a drill hole grid of 2.54 mm. At the same time, more and more connections must be made per integrated circuit, which results in connection pad grids of from 0.3 to 0.4 mm. The problems resulting from the increasingly high integration density are very complex and require a comprehensive solution. They begin first with the production of the conductive pattern.

For the production of a conductive pattern, the drilled copper-clad base material is coated with a resist. While such resists were in the past screen-printable etching or electro resists, nowadays photoresists are predominantly used, which are solid or liquid resists. They are either laminated on to the surface (solid resists) or applied by means of a pouring machine or using rolls (liquid resists). After the application of a mask, the conductive pattern is fixed, for example, by exposure to UV light, with polymerisation of the resist, and exposed by development. This leads to the so-called pattern plating process. In pattern plating, first of all a mask is applied and only the conductor-free areas are exposed and developed. The conductive tracks are then built up by electroplating and the drilled contact holes are clad with copper. After the conductors have been deposited by electroplating, they are, for example, provided with a tin coating, the electro resist is removed and the conductive pattern is etched. Since the etching speed is the same in all directions, the undercutting corresponds approximately to the thickness of the copper film used. The undercutting that occurs in the etching stage of the pattern plating process represents the limit for large-scale application of that process. Moreover, the production of conductors of equal height is frequently not possible as a result of the geometry of the bath or of the printed circuit board.

Accordingly, for microconductor technology, the so-called panel plating process was developed. In that process, starting with the drilled copper-clad base material, first of all the surface of the printed circuit board and the drilled holes are clad with copper by electroplating in order to achieve a uniform thickness of the copper layer. A dry film resist is then laminated on, exposure is effected using a mask, and development is carried out.

In the case of microconductors, however, constrictions frequently occur because the line pressure of the laminating roller is unable to compensate for uneven areas of the base material, so that the dry film resist does not adhere to the same extent in all places. It is especially important that the already copper-clad drill holes should also be protected from the effects of the etching. That is achieved by covering the holes with resist, so-called "tenting".

Further miniaturisation and the technology of surface-mounted components has led to so-called "rest-ring"-free through-holes. Dry film lamination technology cannot be used in this case, because without the so-called rest-rings the resist film cannot be attached to the surface of the printed circuit board. However, in order to be able to cover also rest-ring-free holes with resist and thus protect them from the effects of the etching, so-called electro-immersion coating was found, which deposits a resist film from 5 to 15 μm thick from a coating bath in the hole and on the surface of the printed circuit board. However, that process is very cost-intensive and, because of the thinness of the coating, can be used only together with the panel plating process.

A further problem of microconductors and fine pitch technology is the high connection density of the components and the associated connection grid of currently up to only 0.3 mm. In this respect, in particular the round surface of the solder applied to the connection pads in the hot tinning process has a negative effect. The components frequently slide off the round surface of the solder. As a solution to that problem, DE-A-41 37 045 proposes laminating a film of solder paste on to the entire surface of the printed circuit board provided with conductive areas, exposing the printed circuit board with a positive mask to UV light and exposing the connection points, the pads, by development. Solder paste is introduced into those openings in the resist using a knife. The solder paste that has been introduced is re-melted to form solder deposits. Then the remaining film of solder paste is removed again. Finally, the components are inserted into the printed circuit board and soldered using the reflow soldering process. That process is suitable for small batch sizes. In the case of large-scale industrial manufacture, however, it is uneconomical and results in marked additional costs per square meter of printed circuit board. Moreover, air may be trapped between the conductive tracks when the printed circuit boards are coated with the dry film of solder paste.

The problem underlying the present invention is to make available a process and an apparatus with which it is possible to produce coatings of different thicknesses with photopolymerisable positive and negative resists, to manufacture non-tacky, contact-exposable etching, electro, permanent and solder masks as well as masks for the production of high solder deposits, and to close rest-ring-free drill holes in a reliable manner. A further problem underlying the invention is to make available a standard process with which it is possible to meet the demands that are made by microconductor technology in respect of the quality of the coatings. An economical and technologically variable process is to be made available that is able to replace the many known processes based on different physical principles. There is also to be provided an apparatus that allows the process according to the invention to be carried out in a manner that is as cost-effective as possible and is qualitatively superior.

SUMMARY OF THE INVENTION

That problem and other associated problems are solved by a process for coating printed circuit boards with a coating that is crosslinkable by electromagnetic radiation, especially UV radiation, according to the latter part of patent claim 1 and by an apparatus suitable for that purpose according to the preamble of patent claim 12. In particular, the process according to the invention for coating printed circuit boards comprises the following process steps:

the printed circuit boards on the coating side are kept at room temperature and, as appropriate, are heated to approximately 120° C.; then in a first step, a preferably photopolymerisable, meltable, low-molecular-weight coating composition that has an average molecular weight of approximately from 500 to 1500 and that is highly viscous to solid at room temperature is coated in a thickness of approximately from 10 μm to 200 μm on to the surface(s) of the printed circuit board to be coated;

in a second step, a second, high-molecular-weight, photopolymerisable coating composition having an average molecular weight of approximately from 2000 to 10000 is applied in a thickness of from 2 μm to 20 μm over the first layer; and the printed circuit boards so coated are cooled to room temperature and the two-layer photopolymerisable coating is exposed, preferably in contact with a mask, is developed and is cured fully.

By means of the two-step coating process according to the invention using a low-molecular-weight, meltable coating composition that is highly viscous to solid at room temperature in the first step and a high-molecular-weight coating composition in the second step, it is possible to produce on printed circuit boards coatings that are non-tacky on the surface, so that the printed circuit boards can be handled further without difficulty and, in particular, exposure using masks in the contact process is possible. The two-step coating process is universally applicable; for example, it is in this way possible to produce economically solder masks, etching or electro resists or also permanent resists for additive processes and masks for the production of high solder deposits. The first partial layer of the coating does not necessarily have to be non-tacky, since a high-molecular-weight layer is applied in the second step, which ensures that the surface is non-tacky. The first coating step can be carried out using solvent-based liquid resists, but the use of low-solvent to solventless coating compositions is preferred. Especially, the first coating composition is highly viscous to solid at room temperature but can be melted at elevated temperatures without chemical bonds being destroyed. The first coating can be applied using the curtain pouring process or, alternatively, the roll coating process.

The high-molecular-weight second partial layer can be applied by various methods. However, the second layer is especially applied using the curtain pouring process, by roll coating, by spraying, by lamination or by means of screen printing. After application of the second partial layer, a total coating is obtained the surface of which is non-tacky and which has the required thickness and can be processed further in the customary manner.

The apparatus according to the invention for applying a coating that is crosslinkable by electromagnetic radiation, especially UV radiation, to the surface(s) of printed circuit boards has a number of processing stations for the printed circuit boards arranged along a conveyor belt for the printed circuit boards. It comprises at least one coating station for applying the coating to the surface(s) of the printed circuit boards, and a device for adjusting the temperature of the surface(s) of the printed circuit boards to a temperature that is preferably greater than or equal to room temperature. In particular, a first and a second coating station are provided, the first coating station being arranged for the one- or two-sided application of a preferably photopolymerisable, meltable, low-molecular-weight first coating composition that has an average molecular weight of approximately from 500 to 1500 and that is highly viscous at room temperature, and the second coating station being equipped for the application, over the first coating, of a high-molecular-weight, preferably photopolymerisable, second coating composition having a molecular weight of approximately from 2000 to 10000. The temperature-control device for the surface(s) of the printed circuit boards is arranged upstream of the first coating station or forms part of that coating station.

Preferred variants of the process according to the invention and of the apparatus designed therefor, as well as various possible applications, are the subject of the dependent process and apparatus and use claims, respectively. The advantages of the variants will be seen from the description in conjunction with the diagrammatic drawings.

BRIEF DESCRIPTION OF THE DRAWINGS

The invention and its associated essential details are described in greater detail below with reference to the drawings, in which.

DETAILED DESCRIPTION OF THE PREFERRED EMBODIMENTS

Figure 1:
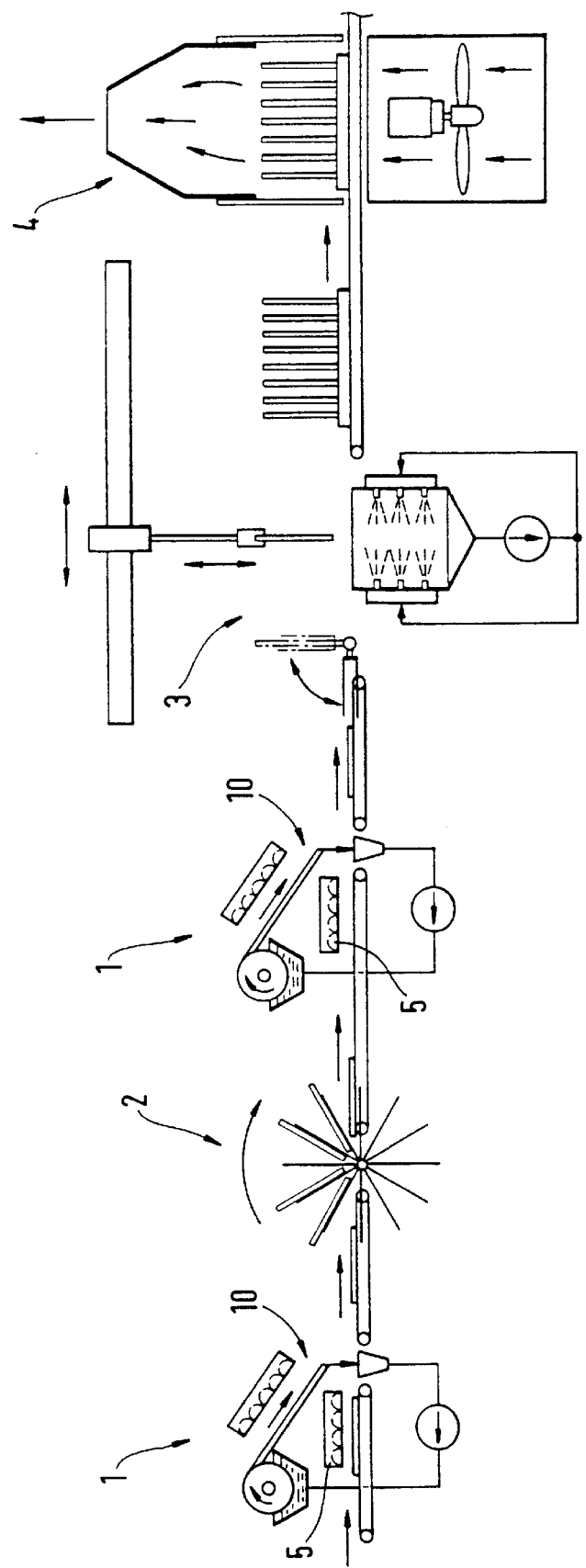
FIG. 1 shows a diagrammatic view of an entire apparatus according to the invention for the two-step coating of printed circuit boards.

The coating apparatus for printed circuit boards shown diagrammatically in FIG. 1 comprises a first coating station 1 for applying a first coating composition and a second coating station 3 for coating with the second coating composition. The first coating station 1 comprises, for example, two identically constructed curtain pouring apparatuses 10 between which there is arranged a turning station 2 for turning the printed circuit boards over. The second coating station 3 is, for example, a spray coating station in which both sides of the printed circuit boards are sprayed with the second coating composition simultaneously. Downstream of the second coating station 3 there is provided a drying device 4 in which the printed circuit boards provided with two coatings are dried to produce a non-tacky surface.

The coating apparatus shown customarily forms part of a larger printed circuit board processing apparatus. Accordingly, there may be provided upstream of the first coating station 1, for example, drilling stations for producing drill holes in the printed circuit boards, mechanical and/or chemical cleaning stations for cleaning the surfaces to be coated, or also electroplating stations. Downstream of the second coating station 3 or of the drying device 4 there are arranged, for example, exposure stations in which the two-layer coating that has been applied is exposed preferably to UV radiation. Downstream thereof, etching stations may be arranged, for example, in which the exposed coating is structured in the desired manner before the printed circuit boards are further treated in other stations. Before being coated with the first coating composition, the surfaces of the printed circuit boards are stabilised at room temperature or heated to a temperature of up to approximately 120° C. in a temperature-control device 5. The temperature-control device 5 is either in the form of a separate unit and arranged immediately upstream of the first coating station, for example as in a roll coating apparatus (FIG. 4), or it forms part of the curtain pouring apparatus, as is shown, for example, in FIGS. 1 to 3.

Figure 2:
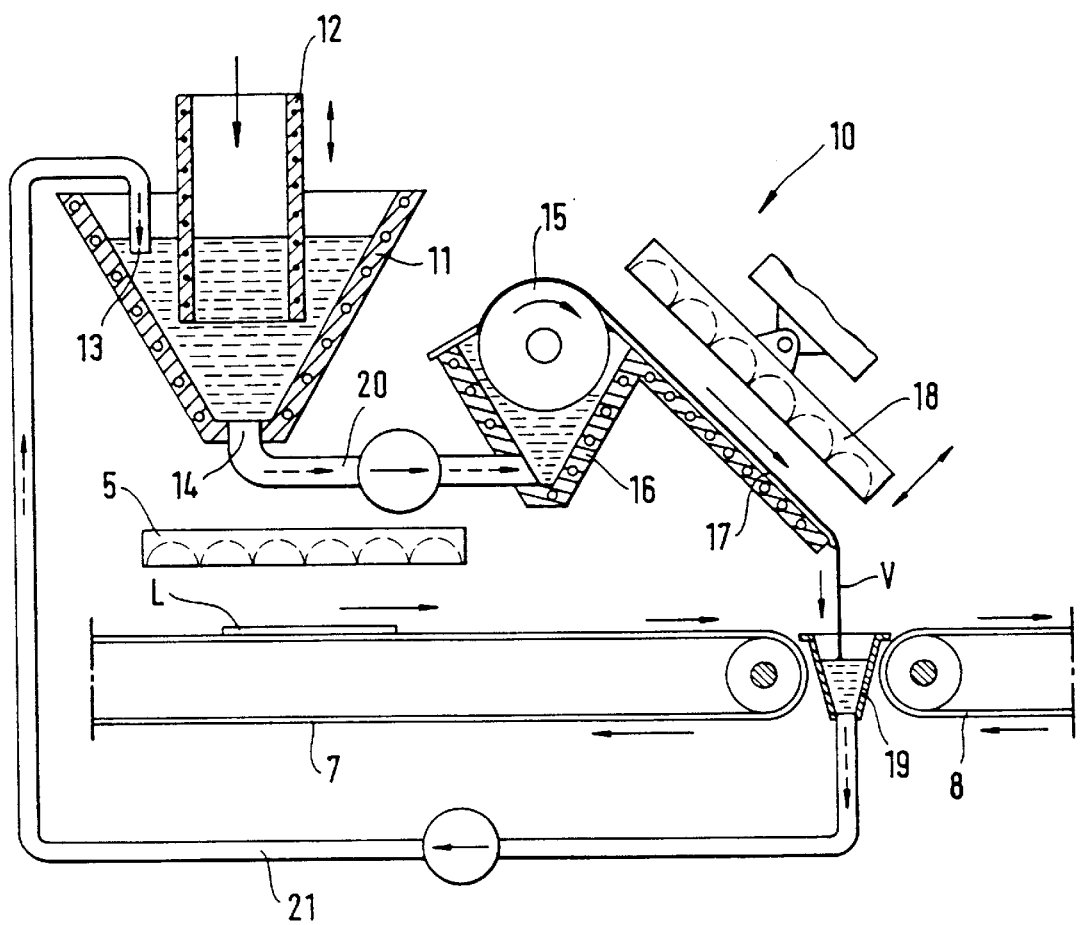
FIG. 2 shows a first variant of a curtain pouring coating apparatus.
Figure 3:
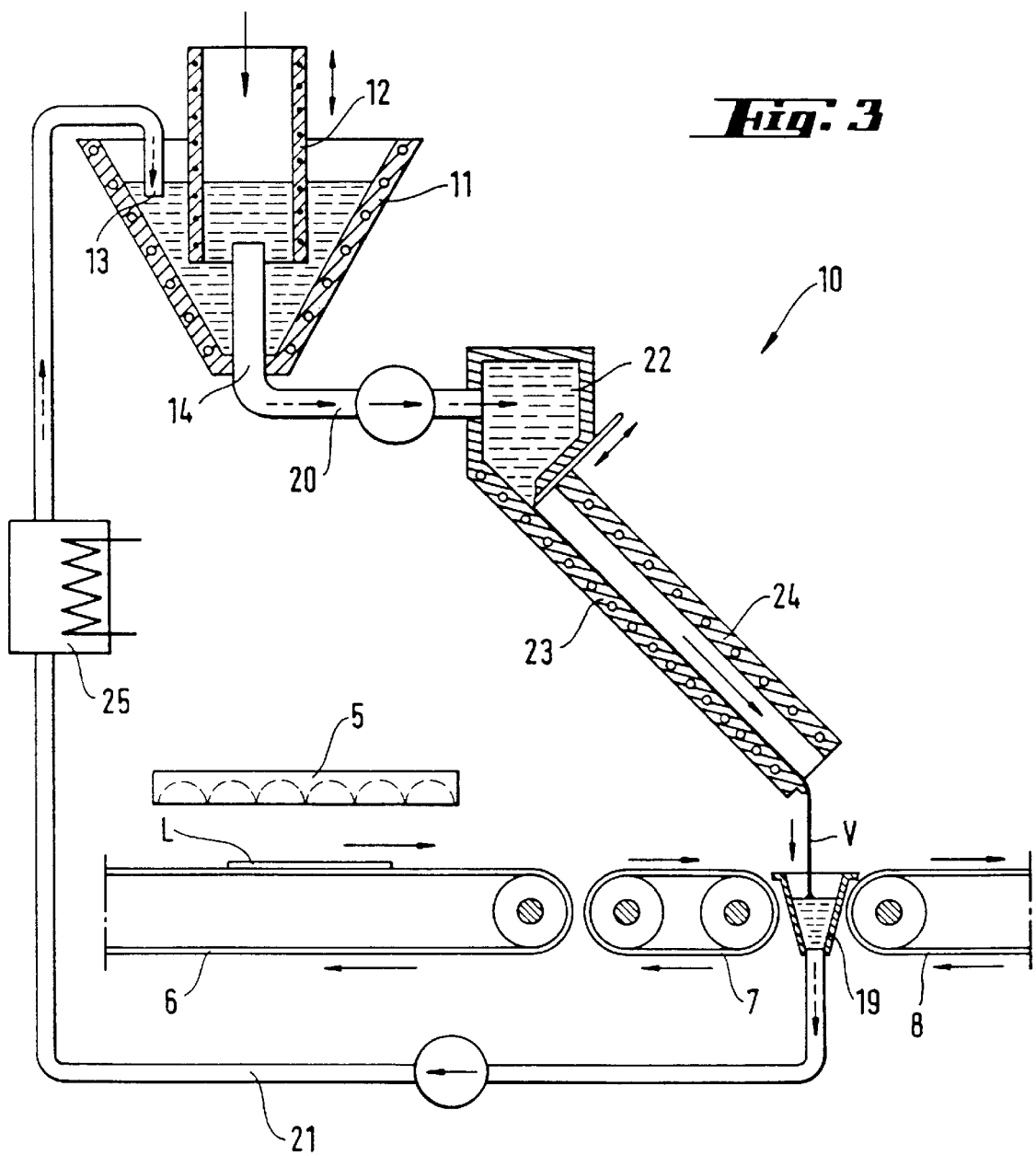
FIG. 3 shows a second variant of a curtain pouring coating apparatus.
Figure 4:
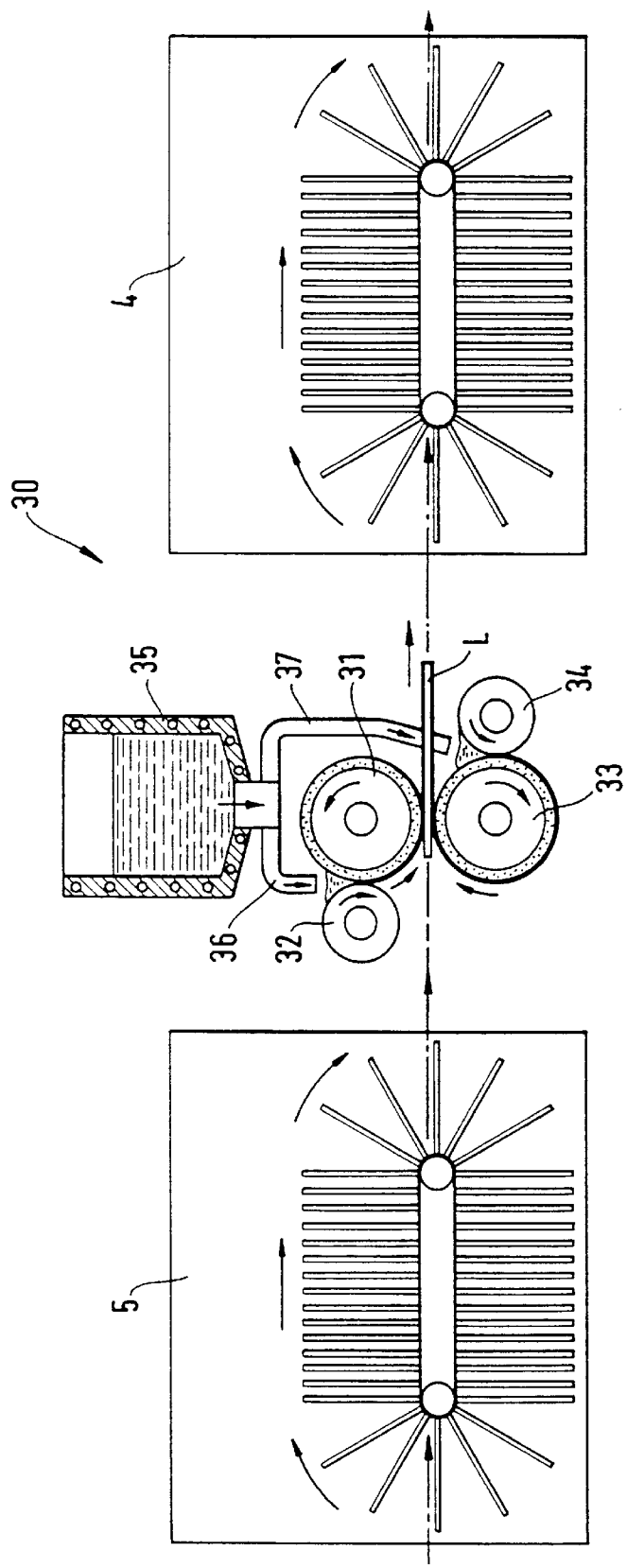
FIG. 4 shows a roll coating apparatus.

FIGS. 2 and 3 show in principle two preferred embodiments of curtain pouring apparatuses, which have been designed especially for the application of a photopolymerisable coating composition that is highly viscous to solid at room temperature and is meltable at elevated temperature and that preferably has an average molecular weight of from 500 to 1500. The curtain pouring apparatuses 10 shown by way of example have a heatable storage tank 11, 12 for the first coating composition, which tank is connected via a heat-insulated or, where appropriate, heatable connecting pipe 20 to a metering device 15, 16 or 22. By means of the metering device, the first coating composition is applied to a heatable knife 17 or a heatable run-off plate 23 or the like, which extends obliquely downwards from the metering device 15, 16 or 22 in the direction of transport of the printed circuit boards and ends above the transport plane of the printed circuit boards L. The angle of inclination is preferably approximately from 300 to 600, especially approximately 450, to the horizontal. A heating device 18 or a heatable cover 24 is arranged above the knife 17 or the run-off plate 23. For example, the heating device 18, as shown in FIG. 2, is an infrared radiator arrangement that is suspended in a pivotable manner in order that the distance of the infrared radiator from the knife 17 or the run-off plate 23 can be varied over their entire length.

The pouring table is indicated by two conveyor belts 7 and 8, between which a gap is left. A collecting vessel 19 for the first coating composition is arranged in that gap beneath the transport plane of the printed circuit boards L and is connected via a heat-insulated and/or heatable return pipe 21 to the storage tank 11, 12. Conveyor pumps are arranged in the connecting pipes 20 and in the return pipe 21, which pumps are used to circulate the first coating composition. Heat exchangers 25 may also be provided in the return pipe, in order to adjust the first coating composition to the desired temperature.

In FIG. 2, the metering device is, for example, a heatable trough 16 that is approximately V-shaped in cross-section and in which there rotates an applicator roll 15, which is likewise heatable. The liquefied first coating composition is picked up by the applicator roll and scraped on to the knife 17. The metering device according to FIG. 3 is a conventional slot pouring device 22 with adjustable pouring lips. The liquid first coating composition flows from the slot pouring device 22 on to the heatable run-off plate 23.

The storage tank is divided into two chambers, an outer chamber 11 and an inner chamber 12, which communicate with each other in the vicinity of the base of the container. As is shown in FIGS. 2 and 3, the chambers are preferably arranged concentrically. The return pipe 21 for the first coating composition opens into the outer chamber 11, which is heatable, at the inlet opening 13. The inner chamber 12 preferably has at the lowest point of its base an outlet 14 for the liquid first coating composition. The outlet 14 of the inner chamber 12 is arranged at a lower level than the opening 13 of the return pipe 21 into the outer chamber 11 and is completely covered by the molten first coating composition during operation. The special construction of the storage tank with two chambers 11, 12 allows the first coating composition to be sucked out through the outlet opening 14 arranged at the lowermost point of the base of the container without air bubbles being formed.

The meltable first coating composition that is highly viscous to solid at room temperature is preferably pre-heated in a warming cabinet and introduced into the heatable storage tank 11, 12 at a viscosity of approximately from 5000 to 10000 mPas. In the storage tank, the first coating composition is heated to approximately 60° C. and is fed through the heat-insulated and/or heatable connecting pipe 20 to the metering device 15, 16 or 17. From there, the first coating composition at a temperature of approximately 60° C. and a viscosity of approximately from 1000 to 5000 mPas is scraped on to the knife 17 or poured on to the sloping run-off plate 23. Because the knife 17 or the run-off plate 23 is sloping, the first coating composition flows downwards. As the first coating composition flows over the knife 17 or the run-off plate 23, which are approximately from 20 to 50 cm long, it is brought to pouring temperature and pouring viscosity. That is effected by means of the heating device arranged above the knife or the run-off plate, which heating device is either an infrared radiator arrangement 18 (FIG. 2) or is formed by a heatable cover 24 arranged at a distance of preferably approximately 10 mm above the knife or the run-off plate (FIG. 3). As a result, the first coating composition is heated to a pouring temperature of approximately from 60° C. to 120° C. Its viscosity on pouring is approximately from 100 to 500 mPas. The printed circuit boards L are moved along at a speed of, for example, approximately from 100 to 200 m/minute beneath the free-falling pouring curtain V that forms and are thus coated with the first coating composition, which has an average molecular weight of approximately from 500 to 1500, in a thickness of approximately from 30 to 200 $\mu$m. Before the printed circuit boards are transported beneath the curtain, their surface to be coated is brought to the required temperature in the temperature-control device 5. That may involve, for example, stabilisation at room temperature, but it may also be desired to increase the temperature of the surface of the printed circuit board to up to approximately 120° C. That is effected, for example, by means of an infrared radiator arrangement that is arranged above the first conveyor belt 7 of the pouring table, or above a pre-accelerator belt 6.

Because the first, low-molecular-weight coating composition is brought to the required pouring temperature and the required pouring viscosity only immediately before being applied, it is ensured on the one hand that no chemical bonds decompose as a result of being subjected to heat for too long, and on the other hand that the polymerisation reaction in the first coating composition is not initiated unintentionally before coating. The first coating composition that flows down in the form of a curtain V is collected in a collecting vessel 19 and pumped back to the storage tank 11, 12 again via the return pipe 21. A heat exchanger 25 may be provided in the return pipe 21, by means of which the first coating composition can be adjusted to a temperature that corresponds to the desired temperature in the storage tank of the first coating composition in the storage tank 11, 12.

When the first side of the printed circuit board L has been coated in that manner, the printed circuit board can immediately be transported further to the second coating station 3, or alternatively it is turned over in a turning station 2 in order that its second side can first be coated with the first, low-molecular-weight coating composition in an identical curtain pouring apparatus.

In an alternative variant of the process according to the invention, the first coating of the printed circuit board is applied in a roll coating apparatus. Depending upon the desired type of coating, one-sided or two-sided, the apparatus may be a single roll coating apparatus for one-sided coating, or two one-sided roll coating apparatuses can be connected in series. As in the case of the curtain pouring apparatuses, a turning station is then arranged between the apparatuses. For the two-sided coating of printed circuit boards it is, however, preferred to use a two-sided roll coating apparatus 30, as is shown by way of example in FIG. 4. The apparatus shown is in particular a two-sided roll coating apparatus 30 that is equipped for the simultaneous coating of both sides of the printed circuit boards and that has two heatable applicator rolls 31, 33. The applicator surface of the applicator rolls 31, 33 is preferably rubberised. Immediately adjacent to each applicator roll 31, 33 there is arranged a metering roll 32, 34, which is likewise heatable. The metering rolls are so arranged that a narrow gap remains between the metering roll 32, 34 and the respective applicator roll. The width of the gap defines the thickness of the film of the first coating composition that forms on the applicator roll 31, 33. For supplying the first coating composition there is preferably provided above the applicator rolls 31, 33 a heatable storage container 35 for the coating composition, from which heat-insulated or heatable supply pipes 36, 37 lead to the respective pair of rolls 31, 32 and 33, 34. The upper and lower applicator rolls 31, 33 are preferably arranged at a distance from each other that corresponds approximately to from 50% to 95% of the thickness of the printed circuit board.

The metering gap between the rubberised applicator rolls 31, 33, which are heated to from 60° C. to 90° C., and the metering rolls 32, 34, which are heated to from 70° C. to 110° C., is so set that a trough of coating composition is formed between the rolls. The first coating composition, which is highly viscous to solid at room temperature, is liquefied in the storage container 35 to such an extent that it can be fed to the two pairs of rolls 31, 32 and 33, 34. For coating, the printed circuit boards L are transported through the gap between the two applicator rolls 31, 33 at a speed of approximately from 5 to 20 m/minute. Because the applicator rolls and the metering rolls are heatable, it is possible to bring the first coating composition to the required application temperature and the required application viscosity only immediately before it is coated on to the surface of the printed circuit board. Prior to coating, the printed circuit boards L are brought to the desired coating temperature in a temperature-control device arranged upstream of the roll coating apparatus 30.

In a preferred process variant, the printed circuit boards L are heated in a temperature-control device 5, prior to coating, so that the temperature of their surface is higher than the temperature of the coating composition applied. In this manner, the first coating composition is liquefied even further on the surface of the printed circuit board in order better to compensate for any uneven areas. The application viscosity of the first coating composition in this preferred process variant is approximately from 1000 to 20000 mPas, preferably approximately from 8000 to 12000 mPas. The coating thickness applied is approximately from 30 to 200 $\mu$m.

The drying device 4 arranged downstream of the roll coating apparatus is, for example, in the form of an air cooler, in which the coated printed circuit boards L are cooled to room temperature.

After application of the first coating composition, the printed circuit boards L are transported to the second coating apparatus 3, in which the second coating composition, which has a high molecular weight of approximately from 2000 to 10000, is applied over the first coating composition. The second coating apparatus 3 may be a roll coating apparatus, a spray coating apparatus, a screen printing coating station, a laminating station or a curtain pouring coating apparatus for the one- or two-sided application of the second coating composition. The two-layer coating is then dried. The high molecular weight of the second coating composition ensures that the surface obtained is non-tacky after drying.

Depending upon the coating composition chosen, the two-layer coating is suitable for various applications. It has been found that in microconductor technology, economic considerations cannot be keyed primarily to raw material, personnel and investment costs, but that it is the reject rate, or yield, that is the deciding economic parameter. This appears all the more pressing, the higher the degree of processing. Therefore, soldering errors on boards equipped with high-quality components have decisive significance. With the use of flux media containing only small amounts of solid and the cessation of cleaning, problems have appeared during soldering. In wave soldering, solder beads form, which adhere especially to smooth surfaces and can lead to short circuits. Since that phenomenon occurs especially on solder mask surfaces, but not with the base material, the reason was seen as being the rough surface of the base material produced by the treatment of the copper film after etching. Although attempts to roughen the solder mask chemically and mechanically have been successful, the insulation properties and the electrolytic corrosion of the coating are impaired as a result.

In order to eliminate that problem, fillers having a relatively large particle size are added to the second coating composition. Preferably, the proportion of fillers in the second coating composition is approximately from 20 to 70% by weight. The average particle size of the fillers is approximately from 5 to 20 $\mu$m. In this manner, a surface having a defined degree of roughness is obtained, which prevents solder beads from adhering during the soldering process.

The two-layer coating may, however, also produce an etching or electro resist, which is removed again after the corresponding treatment of the printed circuit boards. However, it may also give a two-layer permanent resist for additive processes, or be used as a mask for the production of high solder deposits.

Examples of various two-layer coatings are described below. In the Examples, the following resin components are used for the preparation of the coating compositions:

Resin component A

A heat-curable resin that is crosslinkable by means of radiation and has a viscosity of 200000 mpa·s at room temperature and a viscosity of 200 mPa·s at 100° C. The resin is obtained by reacting 1 mol of a triglycidyl ether of cresol novolak having a molecular weight of 580 with 1 mol of acrylic acid and then reacting the resulting product for 3 hours at 60° C. with an unsaturated isocyanato carbamate ester having a molecular weight of 290, which has been obtained by reacting 1 mol of toluylene-2,4- and -2,6-diisocyanate isomeric mixture with 1 mol of hydroxyethyl acrylate in accordance with EP-A-0 194 360, Example 2.

Resin component B

Phenol novolak having a molecular weight of 250 and containing additives, such as fillers, flow agents and curing accelerators, with the following composition:

30 parts by weight of phenol novolak, 30 parts by weight of microtalcum, 30 parts by weight of aluminium oxide trihydrate, 6 parts by weight of ethylanthraquinone, 3 parts by weight of 2-methylimidazole, and 1 part by weight of flow agent Byk®361.
Resin component C
50% solution of a light-sensitive epoxy resin of bis-1,3-(4-glycidyloxy-benzal)-acetone, bisphenol A and tetrabromobisphenol A, having a molecular weight of from 3000 to 3500, prepared in accordance with Example 1 of European Patent 0 075 537.

EXAMPLE 1

In a two-step coating process, a solder mask having a surface that repels solder beads is produced.

| Printed circuit board: | base material FR 4, thickness | 1.6 mm |
|---|---|---|
| | copper cladding: | 17.5 μm |
| | conductor height: | 50 μm |

Coating composition 1
  59 parts by weight of resin component A, and
  41 parts by weight of resin component B.

The viscosity of the first coating composition is approximately 200000 mPas at 25° C. The first coating composition is applied using the curtain pouring process. The pouring temperature is approximately 100° C. The pouring viscosity is approximately 200 mPas. The surface temperature of the printed circuit board is adjusted to approximately 30° C. The transport speed of the printed circuit board beneath the pouring curtain is set at 150 m/minute. The thickness of the first layer of coating is approximately 50 μm.

Coating composition 2
  45 parts by weight of resin component C,
  8 parts by weight of aluminium oxide,
  5 parts by weight of talcum,
  5 parts by weight of barium sulfate,
  4 parts by weight of calcium carbonate,
  9 parts by weight of magnesium oxide,
  1 part by weight of phthalocyanine green, and
  23 parts by weight of methyl glycol.

The second coating composition is applied in a thickness of approximately 5 μm using a spray coating apparatus and is dried with air.

EXAMPLE 2

Using the two-step coating process, a solder resist coating is applied in a thickness greater than 100 μm. The coating is to be processed in a further procedure for the preparation of deposit spaces over fine-pitch IC grids for receiving solid solder.

| Printed circuit board: | base material FR 4 thickness | 1.6 mm |
|---|---|---|
| | copper cladding: | 17.5 μm |
| | conductor height: | 65 μm |
| | IC grid: | 0.3 mm |

Coating composition 1 from Example 1 is applied as the first coating composition using the roll coating process. The temperature of the applicator roll is approximately 70° C. The viscosity of the first coating composition at 70° C. is approximately 1000 mPas. The surface of the printed circuit board has a temperature of approximately 120° C. during coating. The transport speed of the printed circuit board during roll coating is 8 m/minute. The thickness of the coating applied is approximately 100 μm.
Second coating composition: Resin component C
The second coating composition is likewise applied using the roll coating process. The viscosity on coating on to the surface of the printed circuit board is approximately 2000 mpas. The transport speed of the printed circuit boards during coating is approximately 10 m/minute. The thickness of the coating is approximately 10 μm. Then the printed circuit board is dried in a vertical position in an air dryer. Once the printed circuit boards are non-tacky at room temperature, they are exposed to UV radiation on both sides with the application of a mask, and the unexposed areas are dissolved away using a developer solution and the coating that remains is cured fully. Solder paste is introduced into the spaces that have formed over the IC connection pads and is re-melted at approximately 210° C.

EXAMPLE 3

Using the two-step coating process, an electro resist is applied, the first, meltable, low-molecular-weight coating composition being applied using the curtain pouring process and the high-molecular-weight second coating composition being laminated on in the form of a foil, as a dry film resist, by means of rolls.

| Printed circuit board: | base material FR 4, thickness | 1.6 mm |
|---|---|---|
| | conductor height: | 65 μm |
| | drill hole diameter: | 6 mm (maximum) |

First coating composition
  Phenol novolak having a molecular weight of 500 and a viscosity of 20000 mpa·s at 75° C. and 100 mPa·s at 120° C.
  The pouring temperature of the first coating composition is approximately 120° C., and its pouring viscosity is approximately 100 mPas. The temperature of the printed circuit boards is adjusted to approximately 80° C. The transport speed of the printed circuit boards beneath the curtain is approximately 170 m/minute. The coating thickness obtained is approximately 50 μm.
Second coating composition 5: Dry photoresist
  The printed circuit board coated on both sides with melt resist is coated with a dry film photoresist in a second coating operation, in which a foil 25 μm thick is laminated on at approximately 40° C. using a roll laminator. Then the printed circuit board is exposed on both sides with the application of a mask, and the unexposed areas are developed. The open areas can then be selectively plated with noble metals in the desired manner.

What is claimed is:
1. A process for coating printed circuit boards on a coating side with a coating that is crosslinkable by electromagnetic radiation comprising the steps of:
  supplying at least one printed circuit board with the coating side at a predetermined temperature; and then
  coating a first layer of meltable, low-molecular-weight coating composition that has a molecular weight of approximately from 500 to 1500 and that is highly viscous to solid at room temperature in a thickness of approximately 10 μm to 200 μm on to a surface of the at least one printed circuit board to be coated;
  applying a second layer of a high-molecular-weight composition having a molecular weight of approximately from 2000 to 10000, in a thickness of from 2 μm to 20 μm over said first layer; and
  cooling the at least one printed circuit board so coated to room temperature and exposing, developing and curing the first and second layers.
2. A process according to claim 1, wherein the first layer is coated at a temperature of approximately from 60° C. to 120° C. on to the surface of the at least one printed circuit board.

3. A process according to claim 1, wherein the at least one printed circuit board is coated on both sides prior to application of the second layer.

4. A process according to claim 1, wherein the first layer is applied using a curtain pouring process having a pouring viscosity, on coming into contact with the surface of the printed circuit board, of approximately from 100 mPas to 500 mPas.

5. A process according to claim 4, wherein the first layer is applied from a storage container on to at least one of a heatable run-off plate and a heatable knife that extends obliquely downwards in a direction of transport of the at least one printed circuit board, and ends just above a transport plane of the at least one printed circuit board, and is brought to pouring temperature and pouring viscosity by heating devices arranged above the at least one pouring plate and the knife immediately before it is coated on to the surface of the at least one printed circuit board.

6. A process according to claim 1, wherein the first layer is coated on to the surface of the at least one printed circuit board using a roll coating process.

7. A process according to claim 6, wherein an application viscosity of the first layer is approximately from 1000 mPas to 20000 mPas, and a temperature of the surface of the at least one printed circuit board to be coated is higher than a temperature of the first layer applied by a roll coating apparatus.

8. A process according to claim 6, wherein the first layer is applied simultaneously to plural surfaces of the at least one printed circuit board.

9. A process according to claim 1, wherein the second, layer is applied using at least one of a curtain pouring process, roll coating, spraying, lamination and screen printing.

10. A process according to claim 9, wherein the second layer comprises approximately from 20 to 70% by weight, fillers having an average particle size of from 5 µm to 20 µm.

11. A process according to claim 9, wherein the second layer is applied to plural surfaces of the at least one printed circuit board.

12. The process according to claim 9, wherein said steps of coating and applying further comprise a step of:
forming said first and second layers as a solder mask on said at least one printed circuit board.

13. The process according to claim 9, wherein said steps of coating and applying further comprise a step of:
forming said first and second layers as a mask for producing high solder deposits on said at least one printed circuit board.

14. The process according to claim 9, wherein said steps of coating and applying further comprise a step of:
forming said first and second layers as at least one of an etching and an electro resist on said at least one printed circuit board.

15. The process according to of claim 9, wherein said steps of coating and applying further comprise a step of:
forming said first and second layers as a permanent resist for additive processes on said at least one printed circuit board.

16. A Process according to claim 1, wherein said step of supplying further includes the step of:
maintaining the coating side of the at least one print circuit board at room temperature.

17. A process according to claim 1, wherein said step of supplying further includes the step of:
heating the coating side of said at least one printed circuit board to approximately 120° C.

18. A process according to claim 1, wherein said first and second layers are photopolymerisable compositions.

19. A process according to claim 1, wherein said first and second layers are exposed in contact with a mask.

20. A process according to claim 7, wherein said application viscosity is approximately from 8000 mPas to 12000 mPas.

21. A process according to claim 11, wherein said second layer is applied to plural surfaces of the at least one printed circuit board at the same time.

22. An apparatus for applying a coating that is crosslinkable by electromagnetic radiation to at least one printed circuit board, said apparatus comprising:
along a conveyor belt for the at least one printed circuit board, at least one coating station for applying the coating to a surface of the at least one printed circuit board;
a device for adjusting a temperature of the surface of the at least one printed circuit board to a temperature that is greater than or equal to room temperature;
a first coating station that is arranged for at least one-sided application of a first layer of a meltable, low-molecular-weight first coating composition that has a molecular weight of approximately from 500 to 1500 and that is highly viscous at room temperature; and
a second coating station for application, over the first layer, of a second layer of a high-molecular-weight, second coating composition having a molecular weight of approximately from 2000 to 10000, wherein the temperature-control device for the surface of the at least one printed circuit board is arranged at least one of upstream of the first coating station and as a part of the first coating station;
wherein the first coating station has at least one curtain pouring coating device that comprises a storage container for the first coating composition and at least one of a heatable run-off plate and a heatable knife that is connected to the storage container, extends obliquely downwards in a direction of transport of the at least one printed circuit board and ends just above a transport plane of the at least one printed circuit board, as well as heating devices, arranged above the at least one of a run-off plate and knife, by which the first coating composition flowing over the at least one of a run-off plate and knife is brought to pouring temperature and pouring viscosity immediately before it is coated on to the surface of the at least one printed circuit board.

23. An apparatus according to claim 22 wherein the storage container has an outer and an inner chamber which communicate with each other in a vicinity of a base of the storage container, the outer chamber being connected to a supply pipe for the first coating composition and the inner chamber having an outlet for the first coating composition, at the lowermost point of its base, the outlet of the inner chamber being arranged at a lower level than an opening of the supply pipe into the outer chamber and being completely covered by the first coating composition during operation.

24. An apparatus according to claim 22 wherein the first coating station is a roll coating apparatus.

25. An apparatus according to claim 24 wherein the roll coating apparatus further comprises two heatable, rubberised, applicator rolls located opposite each other, between which there is an adjustable gap of approximately from 50% to 95% of a thickness of the at least one printed circuit board, and which are supplied with the first coating composition from a heatable molten composition storage vessel.

26. An apparatus according to claim 22, wherein the second coating station is at least one of a roll coating apparatus, a spray coating apparatus, a laminating station, a screen printing coating station and a curtain pouring coating station for the at least one-sided application of the second coating composition.

27. An apparatus according to claim 22, wherein said first and second layers are photopolymerisable compositions.

28. A coated printed circuit board, comprising:

a first surface;

a first layer of meltable, low-molecular-weight coating composition that has a molecular weight of approximately from 500 to 1500 and that is highly viscous to solid at room temperature in a thickness of approximately 10 $\mu$m to 200 $\mu$m formed on said first surface; and a second layer of a high-molecular-weight composition having a molecular weight of approximately from 2000 to 10000 in a thickness from 2 $\mu$m to 20 $\mu$m formed over the first layer.

* * * * *